United States Patent [19]
Stinchcombe

[11] Patent Number: 5,864,515
[45] Date of Patent: *Jan. 26, 1999

[54] SONAR DATA PROCESSING

[75] Inventor: Mark A. Stinchcombe, Bristol, Great Britain

[73] Assignee: Bae Sema Limited, Surrey, Great Britain

[ * ] Notice: This patent issued on a continued prosecution application filed under 37 CFR 1.53(d), and is subject to the twenty year patent term provisions of 35 U.S.C. 154(a)(2).

[21] Appl. No.: 745,359

[22] Filed: Nov. 8, 1996

[30] Foreign Application Priority Data

Nov. 10, 1995 [GB] United Kingdom .................... 9523072

[51] Int. Cl.$^6$ ........................................... G01S 3/808
[52] U.S. Cl. ............................... 367/103; 367/119
[58] Field of Search ................................... 367/103, 119, 367/129, 135

[56] References Cited

U.S. PATENT DOCUMENTS

| 4,112,430 | 9/1978 | Ladstatter | 367/135 |
| 5,191,546 | 3/1993 | Green | 364/723 |
| 5,268,877 | 12/1993 | Odell | 367/103 |
| 5,345,426 | 9/1994 | Lipschutz | 367/103 |
| 5,369,624 | 11/1994 | Fukukita et al. | 367/103 |
| 5,544,128 | 8/1996 | Kim et al. | 367/119 |

FOREIGN PATENT DOCUMENTS 2192061  12/1987  United Kingdom .

*Primary Examiner*—Ian J. Lobo
*Attorney, Agent, or Firm*—Pillsbury Madison & Sutro LLP

[57] ABSTRACT

Sonar signal processing apparatus for use with an array of transducers, comprising means for reconstructing delayed time series data from an original sampled data stream.

2 Claims, 4 Drawing Sheets

BEAMFORMED OUTPUT

WHERE n IS AN INTERGER NUMBER OF SAMPLES

BEAMFORMED OUTPUT

SONAR DATA PROCESSING

BACKGROUND OF THE INVENTION

1. Field of the Invention

This invention relates to the field of digital data processing and more particularly to time domain digital processing for use in sonar applications.

2. Description of Related Art

One of the greatest threats posed to the safety of a navy's surface ships is still that of the submarine and other underwater weapons. To this end sonar systems have become increasingly complex in order to enable the detection of such submarines or underwater weapons which themselves have been increasingly designed to present a very low observable return to such sonar systems.

In order to counter the increasingly lower observable returns modern sonar systems have become far more complex such that significant increases in the amount of data which is required to be processed are now required. Modern data storage and processing techniques have been applied to such sonar systems with the net result being a substantial increase in the volume of both analogue and digital data which is required to be processed in order to detect such underwater weapons.

The process by which a modern sonar system is able to look in a particular direction in order to locate objects under water is known as beamforming. Conventional beamforming techniques used with state of the art sonar systems require very high levels of performance from digital signal processing hardware. Such sonar systems utilise complex or large arrays of underwater hydrophones in order to receive the sonar information and pass it to the signal processing hardware.

Due to the high levels of data which are now required to be processed, conventional methods of digital signal processing are beginning to reach the upper limits of capability in both data management and storage.

Within the field of digital signal processing two differing techniques are used for managing the input data, namely frequency domain and time domain processing.

In simpler sonar systems where time domain techniques are adopted methods such as up-sampling or over sampling are used to analyse and manipulate data. Such a system requires only simple "shift and add" digital signal processing and as such a direct wide band of operation can be used.

When the levels of data or coefficients required to be processed in sonar systems reaches the level where the storage and signal processing requirements of time domain processing render the system inefficient or slow, frequency domain techniques are used. Such techniques offer some advantages in signal processing efficiency and data management due to the fact that they do not need to up sample or over sample incoming sensor data. Difficulties however occur in frequency domain processing due to the fact that only a narrow band of operation may be analysed at any one time and the process of splitting out frequency and phase information from such incoming sensor data. Frequency domain processing systems can operate a phase shift process in time for only one frequency, whereas in time domain systems no errors occur with frequency changes.

Research into this field has indicated that time domain approaches have the potential to offer the best signal performance tempered with a high processing load requirement whereas frequency domain techniques offer the best processing performance with a minimum of hardware. Research has also indicated that small systems (especially if a wide band of operation is required) time domain techniques offer the simplest and most straight forward and timely solution providing the proposed hardware is sufficiently capable.

Conventional beamforming techniques within modern sonar's require very high levels of performance from Digital Signal Processing (DSP) hardware. Complex or large sonar arrays often adopt frequency domain techniques because they offer advantages of signal processing efficiency and data management in not needing to upsample incoming sensor data. In simpler systems where upsampling or over-sampling can be tolerated, time domain processing is preferred because algorithms require only simple "shift & add" DSP and offer direct wide band operation.

SUMMARY OF THE INVENTION

In view of the above problems of the prior art, it is an object of the present invention to provide a sonar signal processing system which reconstructs delayed time series data from an original sampled data stream.

DESCRIPTION OF PREFERRED EMBODIMENT

Disclosed herein is the implementation of a systolic convolver array that has the form of a Vector Parallel Processor Unit (VPPU) optimised for the efficient implementation of time domain beamforming. This offers a combination high DSP performance together with data management that rival frequency domain methods in complex systems. Along with the descriptions of the VPPU hardware features and algorithms, this application also presents performance results and concludes with the next steps in our development programme.

During the late 1980's BAeSEMA's underwater systems business (then British Aerospace Dynamics—Underwater Systems) were involved in a number of demonstrator programs and products that used various time domain and frequency domain beamforming techniques. Towards the end of this period a research programme was initiated to identify a common beamforming strategy and to develop a suitable extensible DSP hardware engine.

Our early research indicated that time domain approaches have the potential to offer the best signal performance tempered with a high processing load requirement, whereas frequency domain techniques offered the best processing performance with a minimum of hardware. Experience also showed that in small systems (especially if wide band operation is required) time domain techniques offered the simplest and most straightforward and timely solutions providing the proposed hardware is sufficiently capable.

These conclusions, together with a product requirement for wide band operation, lead us to investigate the possibility of producing an efficient and compact time domain beamformer. This research culminated in an adaptation of a signal reconstruction algorithm that could be used with the appropriate hardware in efficiently achieving time domain beamforming.

Figure 1:
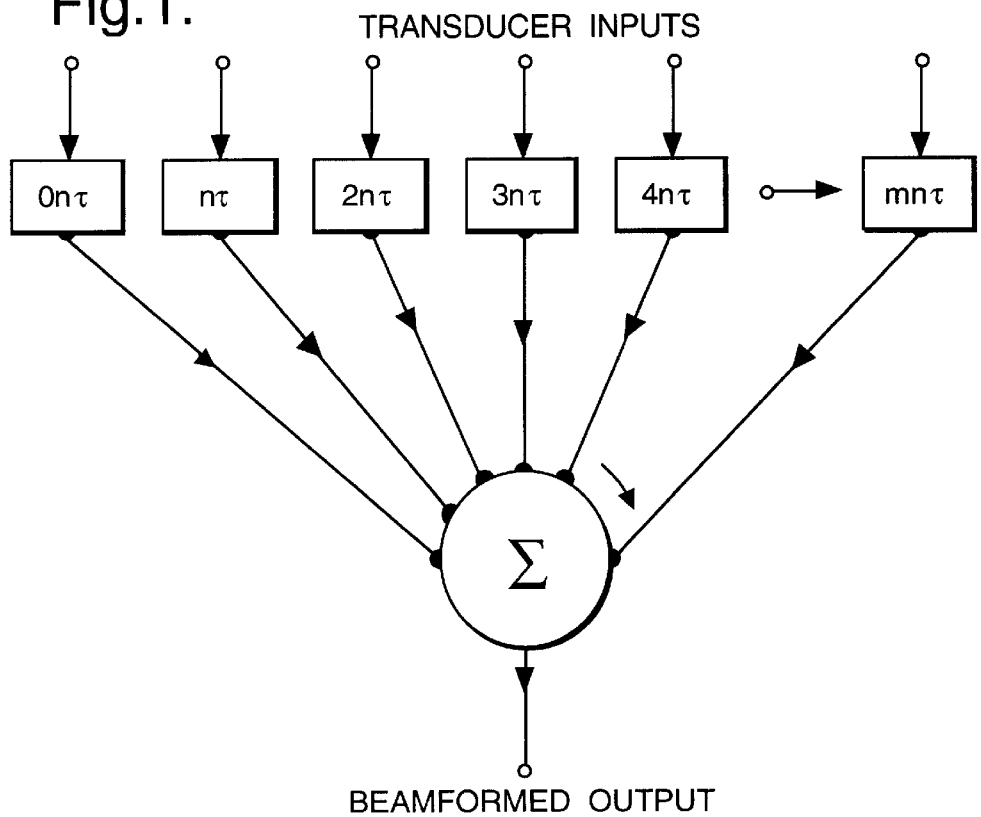
FIG. 1 is a block diagram of time domain beamforming.
Figure 2:
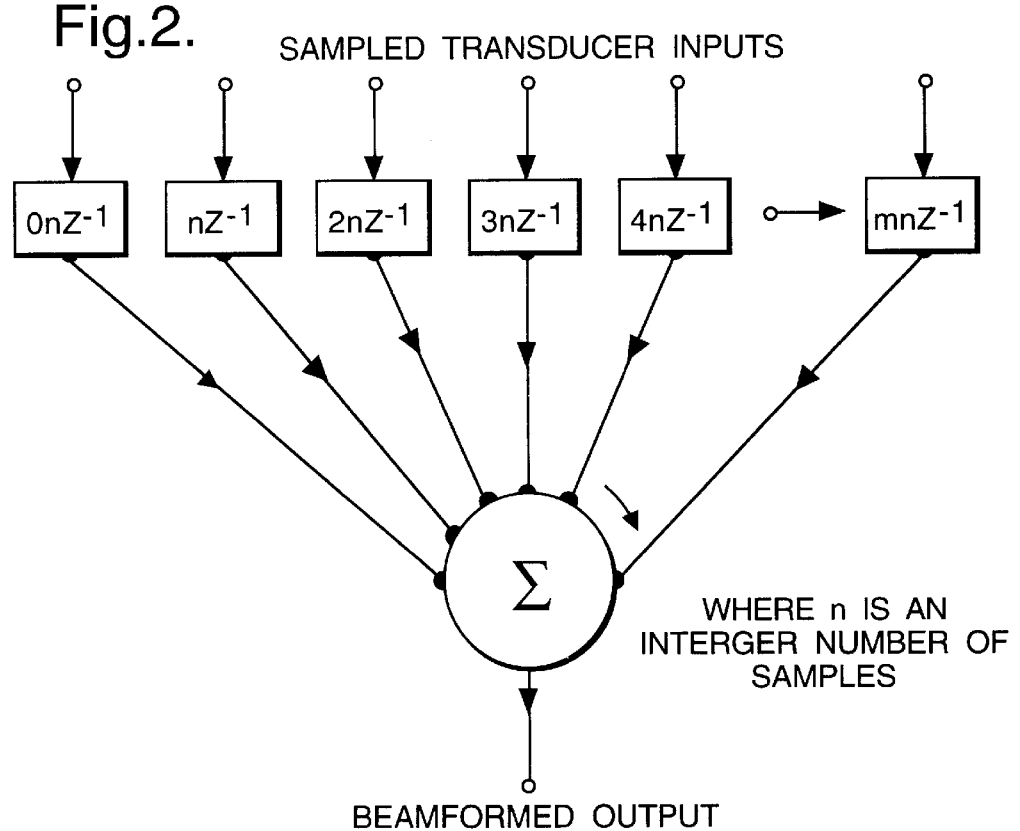
FIG. 2 is a block diagram of beamforming using a sample period delay.
Figure 3:
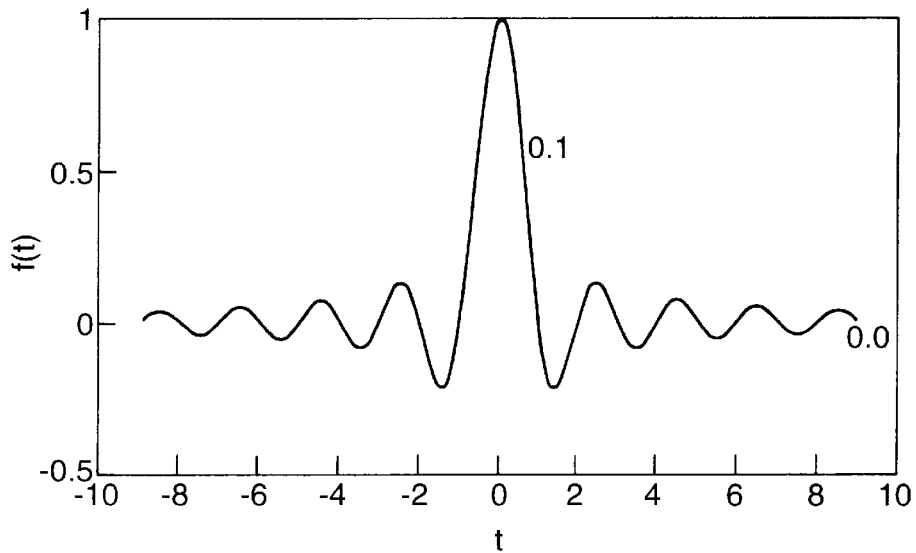
FIG. 3 is a graph of a sinc function.

Consider a linear array of transducers, in which the outputs from these sensors can be directly summed to form a beam in a direction that is perpendicular to the line of the array. In order to steer a beam in a required direction then the signal from each transducer must be subjected to a time delay that is a function of various physical properties of the system, its position within the array and the steer angle. This is diagrammatically represented in FIG. 1. If the input from the sensors is a digitally sampled time series then a number of approaches are commonly used to perform the delay function. The first, most obvious technique is to sample the input at a sufficiently high enough rate such that the required time delays can be accommodated by an integer number of sample periods, and this is referred to as oversampling. The problem with this is that it is likely that an infinitely small sampling period may be required which may be relaxed dependent on the beam distortion and sidelobe levels that can be tolerated. A second problem with this technique is that with high sampling periods compared to the Nyquist rate, high performance analogue to digital converters are required along with a high bandwidth data highway. To overcome this second problem a Nyquist sampling rate may be used along with an interpolation algorithm that regenerates intermediate samples to that of the over-sampled system. This is commonly referred to as upsampling. Although this second technique has removed the problems associated with the front end high sample rate, a problem still exists with the handling and quantity of data within the signal processor. It is at this point, when this last problem cannot be solved, that frequency domain techniques are adopted. However if this explosion of data within the signal processor can be avoided then one may continue to use the time domain solution. To avoid the data explosion it is necessary to be able to derive a time delayed data series directly.

Initially let us look at interpolation by zero padding in an upsampling system. This derives equi-spaced intersample values by padding the original time series with zeros and then filtering (convolution) to remove the generated out of band unwanted components. The filtering function is, in general, a modified (sin(F/f, since function, with its unity and zero crossing points having a period equal to the original sampling period and the intermediate coefficients derived at equi-spaced points corresponding to the zero pad positions in the input time series.

If this operation is examined in more detail that it is realised that a lot of multiply by zeros occur and these may be used to improve performance by ignoring these operations. Also, a more detailed look reveals that the only valid multiplies that take place are those that are obviously relevant to a particular output value with that particular delay from the preceding sampled value and that the coefficients derived are always the same for that particular delay from any preceding sampled value.

This can be shown to be identical to the basic reconstruction formula (Signal processing: Discrete Spectral Analysis, Detection and Estimation—Mischa Schwartz, Leonard Shaw international student edition page 37) that is the basis of interpolation and is defined by the infinite sum of weighted sample values $$f(t) = \sum_{k=0}^{\infty} f(kT_s) \frac{\sin[\pi(t-kT_s)]/T_s}{[\pi(t-kT_s)]/T_s} \quad (1)$$

This formula demonstrates that any value of f at a time t can be reconstructed from an infinite series of $f(kT_s)$ sampled at discrete points $kT_s$ in time. In theory, therefore, we have an equation that can be used to generate a set of coefficients which are subsequently convolved with a sampled time series to generate an arbitrarily delayed reconstruction of the original series. In practice we can have very long time series data, however an infinite (or very long) set of coefficients are impossible to use. The solution of this have been to truncate equation (1) to a fixed coefficient set based on the contributions of distant sample value are small. This, however, is not entirely satisfactory as this can be considered an exercise in filtering where a filter function has been windowed using a rectangular function subsequently causing significant reproduction problems due to Gibb's phenomenon. The properties of window based design of linear phase FIR filters are well known (Analogue and Digital Signal Processing and Coding P M Grant et al, Chartwell-Bratt Studentlitteratur) and a window for our delay function can be similarly selected depending system requirements. For simplicity our initial systems adopted a Gaussian form window that was designed such that the maximum excursion of the most distant coefficient (from k=0) approaches a least significant bit within the signal processing core.

$$g(t) = \exp-(\pi(1-kT_s)/10.T_s)^2 \quad (2)$$

where k=−7 to +8 and the coefficients are represented by 12 bits.

The previous section showed the limitations of conventional time domain techniques and developed a simple time delay function that may be used to overcome problems associated with oversampling or upsampling. Although having a time delay function is used it is still necessary to develop the appropriate hardware which can efficiently handle a significant amount of input data and subsequently process it to form beams. Recent commercial developments presented off the shelf components that, when combined, provided all the necessary functions required for this task and this developed into the Vector Parallel Processing Unit (VPPU).

Figure 4:
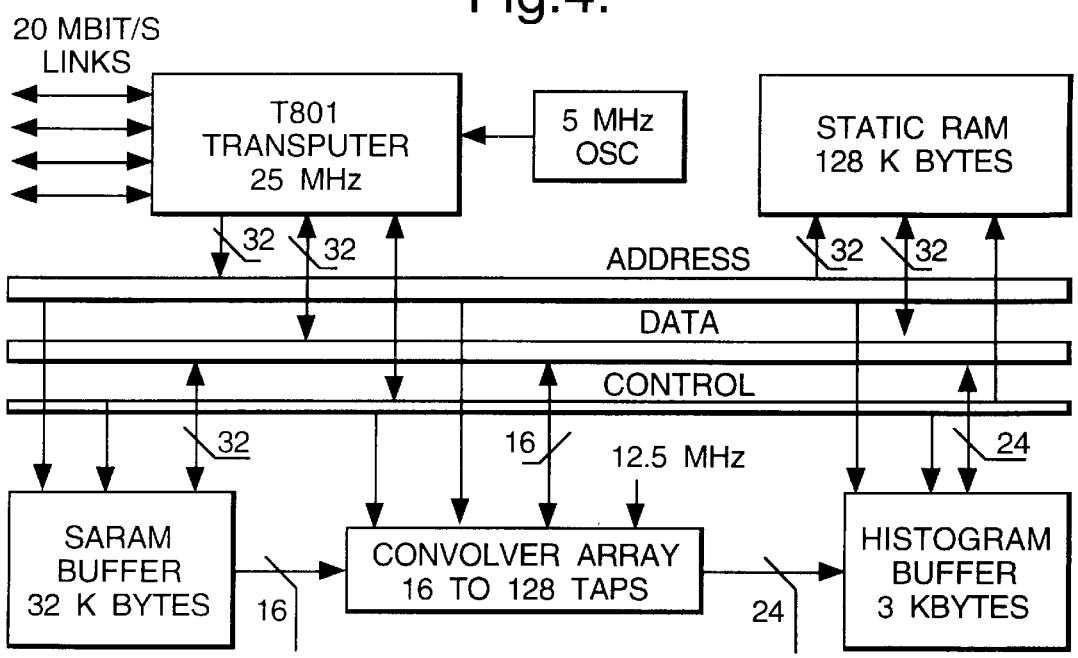
FIG. 4 is a block diagram of VPPU system architecture.
Figure 5:
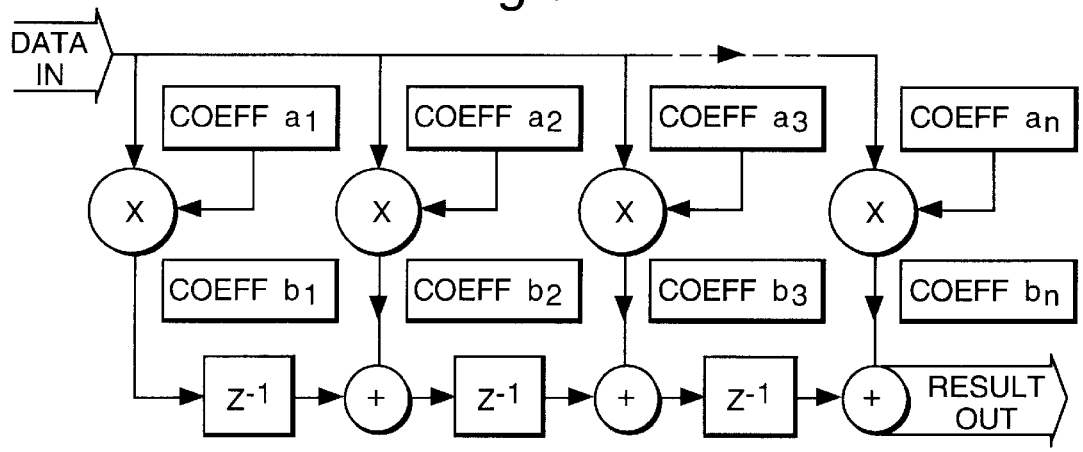
FIG. 5 is a block diagram of a convolver array.

The resulting VPPU design efficiently executes the high performance vector signal processing required for wide band time delay beamforming. The system architecture, shown in FIG. 4, comprises components selected for their ability to handle specific tasks required for vector processing. These consist of the transputer host, the SARAM Sequential Access/RAM), convolver array and a histogram buffer.

Considering the convolver array first, this device is a systolic array of 16 delays, multipliers and adders in the form of an FIR filter (or convolver) allowing the use of two banks of coefficients. The convolver array implements the function $$Y_m = \sum_{k=0}^{n-1} x_{m-k} a_k \quad (3)$$

which is used to realise the time operation where x is the input time series, α is the product of the delay function within equation (1) and the Gaussian window function, equation (2) and n is number of stages in the convolver array. The convolver array can therefore apply a time delay to a time series data set (vector or a set of delays to a set of data stream (vectors) if multiplexed. It should be noted that in equation (3) a history of n time series samples are required in order to receive the first valid output. This has the implication that if this device is being multiplexed then there is an available performance decrease given by equation (4) indicating that the longer the series the more efficient this operation will be.

$$\mathit{eff} = \frac{x\text{length}}{x\text{length} + n} \cdot 100\% \qquad (4)$$

Figure 6:
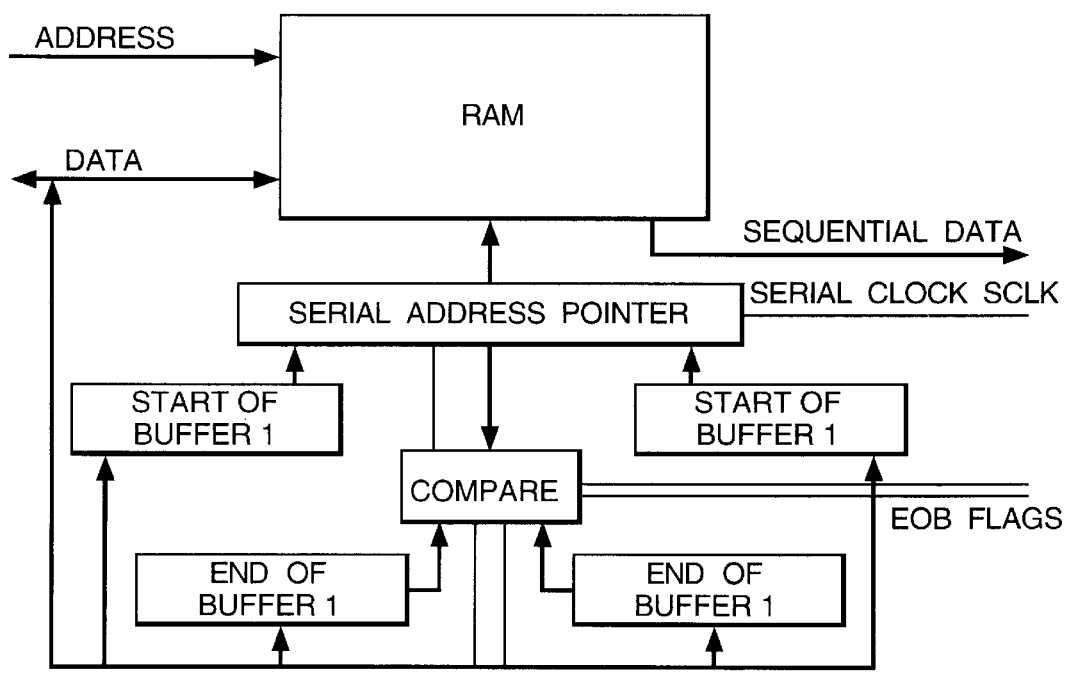
FIG. 6 is a block diagram of a SARAM.

The VPPU is designed to be able to process sets of vectors and the supply of the vectors to be convolver array is performed by the SARAM see FIG. 6. This is a dual port memory device with the processor having a random access capability through one port and through the second port sequential access is provided to the convolver array. The sequential port allows double buffer operation with a buffer chaining mode. This is achieved by allowing the user to program a set buffer registers that define the start and end of two buffers. When set into operation a comparator compares the end of buffer registers with the current value of the address pointer, when equal the address contained within the next start of buffer register is loaded into the address pointer; thus, the system is able to output a continuous set of vectors to the convolver array.

As each vector is sent the coefficients in the convolver array may also be updated as a double buffer operation therefore allowing a data vector from each sensor to have an individual time delay applied and subsequently only requiring a vector summation to complete the beamforming process. This is achieved in an image processing histogrammer device coupled with some address logic that simply converts it to a vector accumulator.

The SARAM, convolver and vector accumulator comprise the DSP function element of the VPPU board. The DSP function is under the control of a programmable sequencer engine that allows the correct synchronous operation of these elements together with the asynchronous control functions from the host control processor. One advantage of this architecture is that the DSP element is self contained and may be simply coupled to any host processor type.

Figure 7:
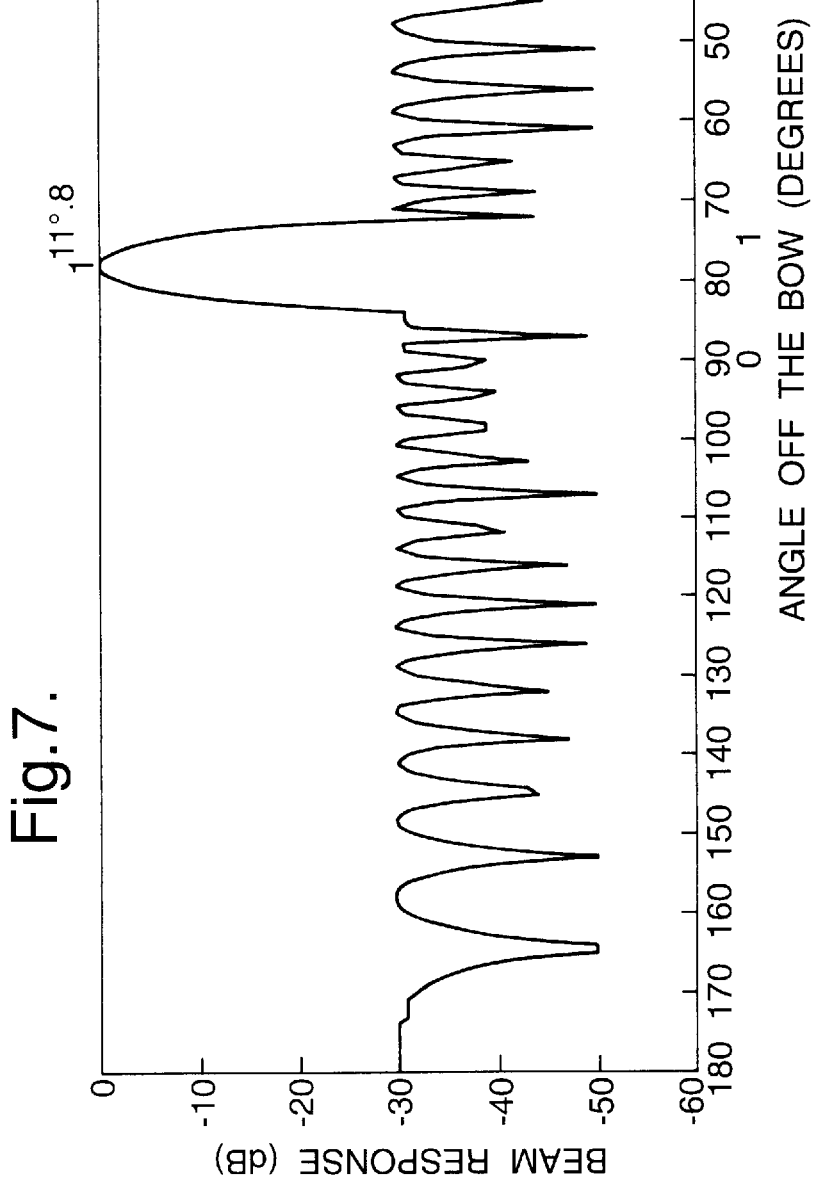
FIG. 7 is a graph of a beam plot from a 32 element array using Chebyshev filtering.

The performance figures presented here are for the VPPU-E (Evaluation model). In this development VPPU the DSP engine is running at 50% clock speed and the host processor having insufficient performance to complete its tasks during the time for forming one beam, therefore the DSP engine is halted to allow the processor to catch up. However even with these limitations the VPPU is able to form 15 beams, in real time, from 32 hydrophone sensors each sampled at a 12 kHz rate together with the added complication that they are not simultaneously sampled. The production VPPU is estimated to perform at three times this rate giving an ability to process 45 beams at the above data rate. FIG. 7 displays the resultant beam plot function output from the VPPU. This plot demonstrates no deformity in the side lobe levels which occur with inappropriate interpolation functions (Beam Steering Distortions Due to Interpolation. D Butler, B. Hill Plessey Company, Proceedings of the Institute of Acoustics, Advances in Underwater Acoustics Group Conference AUWE Portland Dec. 1/2, 1981) or insufficiently up/oversampled time series data.

A brief history has been presented outlining our work in developing an algorithm and hardware architecture for time domain beamforming and general vector processing. The algorithm is based on the use of the fundamental sinc function this is essential in the theory of digital synthesis and the reconstruction/conversion from the digital to analogue domain. The concept of windowing has been incorporated to limit the infinite nature of the delay function in order to be able to accommodate it within practical constraints. The VPPU hardware has been described showing how a set data vectors can be continuously passed to systolic convolver array and then subsequently to programmable length vector accumulator. The results demonstrate the performance, use and operation of the time delay function allowing ability to reconstruct a delayed time series from the original sampled data stream.

The next stage of development is to increase the clock rate of the DSP engine and to provide an enhanced performance host processor. The DSP engine has been designed such that coupling to different host control processors is a straight forward matter allowing the use of processors appropriate to the overall design concept of the end system.

REFERENCES

Signal processing: Discrete Spectral Analysis, Detection and Estimation—Mischa Schwartz, Leonard Shaw International student edition page 37.

Analogue and Digital Signal Processing and Coding P M Grant et al, Chartwell-Bratt Studentlitteratur.

Beam Steering Distortion Due to Interpolation. D. Butler, B. Hill Plessey Company, Proceedings of the Institute of Acoustics, Advances in Underwater Acoustics: Underwater Acoustics Group Conference AUWE Portland Dec. 1/2, 1981.

I claim:

1. A sonar signal processing apparatus for use with an array of transducers, said apparatus comprising:

a systolic convolver for receiving an original sampled data stream and convolving said data stream to produce a convolved data stream; and a vector accumulator for receiving and accumulating said convolved data stream;

whereby said vector accumulator derives delayed time series data from said original sampled data stream.

2. A method of time domain digital signal processing wherein delayed time series data is reconstructed from an original sampled data stream, said method comprising:

controllably supplying said sampled data for input to a systolic convolver means;

convolving the sampled data in the systolic convolver to obtain an output therefrom;

controllably inputting said output from said systolic convolver to a vector accumulator; and accumulating said output from said systolic convolver in said vector accumulator to produce delayed time series data.

* * * * *